(12) United States Patent
Onishi et al.

(10) Patent No.: US 6,621,132 B2
(45) Date of Patent: Sep. 16, 2003

(54) SEMICONDUCTOR DEVICE

(75) Inventors: Yasuhiko Onishi, Nagano (JP);
Tatsuhiko Fujihira, Nagano (JP);
Katsunori Ueno, Nagano (JP); Susumu Iwamoto, Nagano (JP); Takahiro Sato, Nagano (JP)

(73) Assignee: Fuji Electric Co., Ltds. (JP)

( * ) Notice: Subject to any disclaimer, the term of this patent is extended or adjusted under 35 U.S.C. 154(b) by 0 days.

(21) Appl. No.: 09/942,378

(22) Filed: Aug. 30, 2001

(65) Prior Publication Data

US 2002/0027237 A1 Mar. 7, 2002

(30) Foreign Application Priority Data

Sep. 5, 2000 (JP) ........................ 2000-268462

(51) Int. Cl.[7] .................. H01L 29/76; H01L 29/94; H01L 31/062; H01L 31/113; H01L 31/119
(52) U.S. Cl. ...................... 257/409; 257/330
(58) Field of Search .................. 438/138, 133, 438/135, 309, 270, 259, 212; 257/331, 129, 139, 341, 409, 144, 495, 653, 342, 654, 262, 110, 120, 548

(56) References Cited

U.S. PATENT DOCUMENTS 3,988,768 A * 10/1976 Anthony et al. ............... 29/74
4,216,488 A * 8/1980 Huston ......................... 357/39
4,754,310 A   6/1988 Coe ............................. 357/13
5,216,275 A   6/1993 Chen .......................... 257/493
5,438,215 A   8/1995 Tihanyi ....................... 257/401
6,040,600 A * 3/2000 Uenishi et al. ............... 257/330
6,204,097 B1 * 3/2001 Shen et al. ................... 438/133
6,221,721 B1 * 4/2001 Takahashi .................... 438/270
6,284,603 B1 * 9/2001 Ho Simon et al. .......... 438/264
6,331,466 B1 * 12/2001 Takahashi et al. ........... 438/268

FOREIGN PATENT DOCUMENTS

| JP | 354057872 A | * 5/1979 |
| JP | 9-266311 | 10/1997 |
| JP | 2000-40822 | 2/2000 |

* cited by examiner

Primary Examiner—Wael Fahmy
Assistant Examiner—Dana Farahani
(74) Attorney, Agent, or Firm—Rossi & Associates

(57) ABSTRACT

The super-junction semiconductor device, which facilitates increased switching speed and reduced on-resistance, includes an alternating conductivity type layer formed of n-type drift regions and p-type partition regions arranged alternately, a pair of the n-type drift region and p-type partition region repeating at a first repeating pitch, and trenches each containing a gate electrode buried therein, the trenches being arranged repeatedly at a second repeating pitch wider than the first repeating pitch. The device further includes one or more n-type channel regions between a p-type partition regions and a p-type well region.

19 Claims, 8 Drawing Sheets

SEMICONDUCTOR DEVICE

FIELD OF THE INVENTION

The present invention relates to a semiconductor structure applicable to semiconductor devices, such as MOSFET's (metal oxide semiconductor field effect transistors), IGFET's (insulated gate field effect transistors), IGBT's (insulated gate bipolar transistors), bipolar transistors and diodes. More specifically, the present invention relates to a semiconductor structure, that provides a current path in the ON-state of the device and is depleted in the OFF-state of the device to realize a high breakdown voltage and a high current capacity.

BACKGROUND OF THE INVENTION

The semiconductor devices may be classified into a lateral device, that arranges the main electrodes thereof on one major surface and makes a drift current flow parallel to the major surface, and a vertical device, that distributes the main electrodes thereof on two major surfaces facing opposite to each other and makes a drift current flow perpendicular to the major surfaces.

In the vertical semiconductor device, a drift current flows in the thickness direction of the semiconductor chip (vertically) in the ON-state of the semiconductor device and depletion layers expand also in the thickness direction of the semiconductor chip (vertically) in the OFF-state of the semiconductor device. In the conventional vertical planar-type n-channel MOSFET, the very resistive n-type drift layer thereof provides a drift current path in the ON-state of the MOSFET and is depleted in the OFF-state thereof, resulting in a high breakdown voltage.

Thinning the n-type drift layer, that is shortening the drift current path, facilitates substantially reducing the on-resistance, since the drift resistance against the drift current is reduced. However, the thinning the n-type drift layer narrows the width between the drain and the base, for that depletion layers expand from the pn-junctions between p-type base regions and the n-type drift layer. Due to the narrow expansion width of the depletion layers, the depletion electric field strength soon reaches the critical value for silicon. Therefore, breakdown is caused at a voltage lower than the designed breakdown voltage of the device. A high breakdown voltage is obtained by thickening the n-type drift layer. However, the thick n-type drift layer inevitably causes high on-resistance, that further causes loss increase. In other words, there exists a tradeoff relation between the on-resistance and the breakdown voltage.

The tradeoff relation between the on-resistance and the breakdown voltage exists in the other semiconductor devices such as IGBT's, bipolar transistors and diodes. The tradeoff relation exists also in the lateral semiconductor devices, in that the flow direction of the drift current in the ON-state of the device and the expansion direction of the depletion layers expanded by applying a reverse bias voltage in the OFF-state of the device are different from each other.

European Patent 0 053 854, U.S. Pat. No. 5,216,275, U.S. Pat. No. 5,438,215, and Japanese Unexamined Laid Open Patent Application H09-266311 disclose semiconductor devices, which facilitate reducing the tradeoff relation between the on-resistance and the breakdown voltage. The drift layers of the disclosed semiconductor devices are formed of an alternating conductivity type layer including heavily doped n-type regions and heavily doped p-type regions arranged alternately. The alternating conductivity type layer, depleted in the OFF-state, facilitates sustaining a high breakdown voltage.

The drift layers of the disclosed semiconductor devices are not a uniform impurity diffusion layer of one conductivity type but an alternating conductivity type layer formed of n-type drift regions and p-type partition regions arranged alternately. The n-type drift regions and p-type partition regions are extended vertically.

Since the entire drift layer is depleted by the depletion layers expanding laterally from the vertically extending pn-junctions between n-type drift regions and p-type partition regions in the OFF-state of the MOSFET, a high breakdown voltage is obtained even when the impurity concentrations in the n-type drift regions and the p-type partition regions are high.

Japanese Unexamined Laid Open Patent Application No. 2000-40822 discloses the method of manufacturing such a semiconductor device including an alternating conductivity type layer. Hereinafter, the semiconductor device including an alternating conductivity type layer, that provides a current path in the ON-state of the device and is depleted in the OFF-state of the device, will be referred to as the "super-junction semiconductor device".

Generally, the on-resistance Ron x A) of the planar-type super-junction MOSFET is described by the following formula (1).

$$Ron \times A = (Rs + Rch + Racc + R_{JFET} + Rdrift + Rd) \times A \quad (1)$$

Here, Rs is the resistance of the source layer, Rch the channel resistance, Racc the resistance of the accumulation layer, $R_{JFET}$ the resistance due to the junction FET (JFET) effect, Rdrift the drift resistance and Rd the resistance of the drain layer.

Since the drift resistance Rdrift is described by the following formula (2) for the super-junction semiconductor device, the drift resistance Rdrift increases only in proportion to the increasing breakdown voltage. Therefore, the super-junction MOSFET facilitates reducing the on-resistance much more drastically than the conventional MOSFET's. The on-resistance is further reduced by reducing the thickness d of the n-type drift regions in the alternating conductivity type layer at the same breakdown voltage.

$$Rdrift \times A = (4 \times d \times Vb)/(\mu \times \in_o \times \in_s \times Ec^2) \quad (2)$$

Here, $\mu$ is the electron mobility, $\in_o$ the dielectric permeability of the vacuum, $\in_s$ the relative dielectric permeability of silicon, d the thickness of the n-type drift region, Ec the critical electric field strength, and Vb the breakdown voltage.

As the drift resistance Rdrift is reduced drastically, the other resistance components in the foregoing formula (1) become more influential. Especially, the resistance $R_{JFET}$ due to the JFET effect occupies a considerable part of the on-resistance. To obviate this problem, a trench-type MOSFET is proposed. The trench-type MOSFET includes trenches dug from the surface of the semiconductor chip and gate electrodes buried in the respective trenches so that channel may be created in the side wall portions of the trenches.

Although the on-resistance is reduced by aligning the trenches at a repeating pitch, where a pair of an n-type drift region and a p-type partition region is arranged repeatedly, the gate input capacitance and the feedback capacitance are increased, resulting in a low switching speed. The input capacitance increase causes an increase of the driving electric power.

In view of the foregoing, it is an object of the invention to provide a super-junction semiconductor device, that facilitates greatly reducing the tradeoff relation between the breakdown voltage and the on-resistance, preventing the input capacitance and the feedback capacitance from increasing, increasing the switching speed and further reducing the on-resistance.

SUMMARY OF THE INVENTION

According to an embodiment of the invention, there is provided a semiconductor device including: a semiconductor chip having a first major surface and a second major surface facing opposite to the first major surface; a first main electrode on the first major surface; a second main electrode on the second major surface; a layer with low electrical resistance on the side of the second major surface; an alternating conductivity type layer between the first major surface and the layer with low electrical resistance; the alternating conductivity type layer including first semiconductor regions of a first conductivity type and second semiconductor regions of a second conductivity type arranged alternately; a pair of the first semiconductor region and the second semiconductor region being repeated at a first repeating pitch; trenches dug from the first major surface; a gate electrode buried in each of the trenches with a gate oxide film interposed therebetween; the gate electrodes being arranged repeatedly at a second repeating pitch different from the first repeating pitch; well regions of the second conductivity type in contact with the gate oxide films in the side walls of the trenches; and source regions of the first conductivity type isolated by the well regions from the first semiconductor regions, the source regions contacting with the gate oxide films in the side walls of the trenches.

Preferably, the second repeating pitch is wider than the first repeating pitch.

Since the gate area per unit area is reduced by setting the second repeating pitch, where the gate electrodes or the trenches are arranged repeatedly, more widely than the first repeating pitch, where a pair of the first semiconductor regions and the second semiconductor regions is arranged repeatedly, the input capacitance and the feedback capacitance are reduced.

Preferably, the semiconductor device further includes one or more third semiconductor regions of the first conductivity type between the well regions and the alternate arrangement of the first semiconductor regions and the second semiconductor regions, the one or more third semiconductor regions being connected to the first semiconductor regions.

Since the first semiconductor regions are connected to each other through the one or more third semiconductor regions, the input capacitance and the feedback capacitance are reduced without increasing the on-resistance as much.

According to another embodiment of the invention, there is provided a planar-type semiconductor device including: a semiconductor chip having a first major surface and a second major surface facing opposite to the first major surface; a first main electrode on the first major surface; a second main electrode on the second major surface; a layer with low electrical resistance on the side of the second major surface; an alternating conductivity type layer between the first major surface and the layer with low electrical resistance; the alternating conductivity type layer including first semiconductor regions of a first conductivity type and second semiconductor regions of a second conductivity type arranged alternately; a pair of the first semiconductor region and the second semiconductor region being repeated at a first repeating pitch; gate electrodes above the first major surface of the semiconductor chip with gate oxide films interposed therebetween; the gate electrodes being arranged repeatedly at a second repeating pitch different from the first repeating pitch; well regions of the second conductivity type in contact with the gate oxide films; source regions of the first conductivity type isolated by the well regions from the first semiconductor regions, the source regions contacting with the gate oxide films; and one or more third semiconductor regions of the first conductivity type between the well regions and the alternate arrangement of the first semiconductor regions and the second semiconductor regions, the one or more third semiconductor regions being connected to the first semiconductor regions.

Preferably, the trenches are dug deeply enough to reach the one or more third semiconductor regions. Preferably, the trenches are dug deeply enough to reach the inside portions of the first semiconductor regions.

When the trenches are deep enough to reach the one or more third semiconductor regions, it is not necessary to adjust the locations of the trenches and the locations of the first semiconductor regions and the on-resistance is reduced to some extents.

Preferably, the horizontal arrangement of the gate electrodes or the trenches is shaped with a stripe pattern.

Although the horizontal arrangement of the gate electrodes or the trenches may be shaped with a stripe pattern or a cell pattern, the stripe pattern is preferable for easy manufacture.

Preferably, the net impurity concentrations in the first semiconductor regions and the second semiconductor regions are almost the same.

When the net impurity concentrations in the first semiconductor regions and the second semiconductor regions are almost the same, a high breakdown voltage is obtained independently of the shapes of the first semiconductor regions and the second semiconductor regions.

Preferably, the boundaries between the first semiconductor regions and the second semiconductor regions extend almost perpendicular to the first major surface or the second major surface of the semiconductor chip.

When the boundaries between the first semiconductor regions and the second semiconductor regions extend obliquely to the first major surface, it is difficult to obtain a high breakdown voltage, since the portions, thereto the electric field localizes, are caused, and the on-resistance increases, since the substantial drift length is prolonged.

Preferably, the first semiconductor regions and the second semiconductor regions are shaped with respective stripes.

When the first semiconductor regions and the second semiconductor regions are shaped with respective stripes, the first semiconductor regions and the second semiconductor regions are patterned easily and the net impurity concentrations in the first semiconductor regions and the second semiconductor regions are adjusted easily.

Preferably, the stripes of the first semiconductor regions and the second semiconductor regions extend almost perpendicular to the stripes of the gate electrodes.

When the stripes of the first semiconductor regions and the second semiconductor regions are extended perpendicular to the stripes of the gate electrodes, it is not necessary to precisely adjust the locations of the gate electrodes or the trenches and easy manufacture of the semiconductor device is facilitated.

Preferably, the first semiconductor regions or the second semiconductor regions are located at the lattice points of a two-dimensional trigonal lattice, a two-dimensional orthogonal lattice or a two-dimensional hexagonal lattice.

When the net impurity amounts in the first semiconductor regions and the second semiconductor regions are the same, a high breakdown voltage is obtained independently of the shapes of the first semiconductor regions and the second semiconductor regions.

Preferably, the trenches with the gate electrodes buried therein are arranged like a two-dimensional trigonal lattice, a two-dimensional orthogonal lattice or a two-dimensional hexagonal lattice. The trenches may be shaped with various shapes.

BRIEF DESCRIPTION OF THE DRAWINGS

The invention will now be described with reference to certain preferred embodiments thereof and the accompanying drawings, wherein.

DETAILED DESCRIPTION OF THE INVENTION

Now the invention will be explained hereinafter with reference to the accompanied drawing figures which illustrate the preferred embodiments of the invention.

First Embodiment

Figure 1:
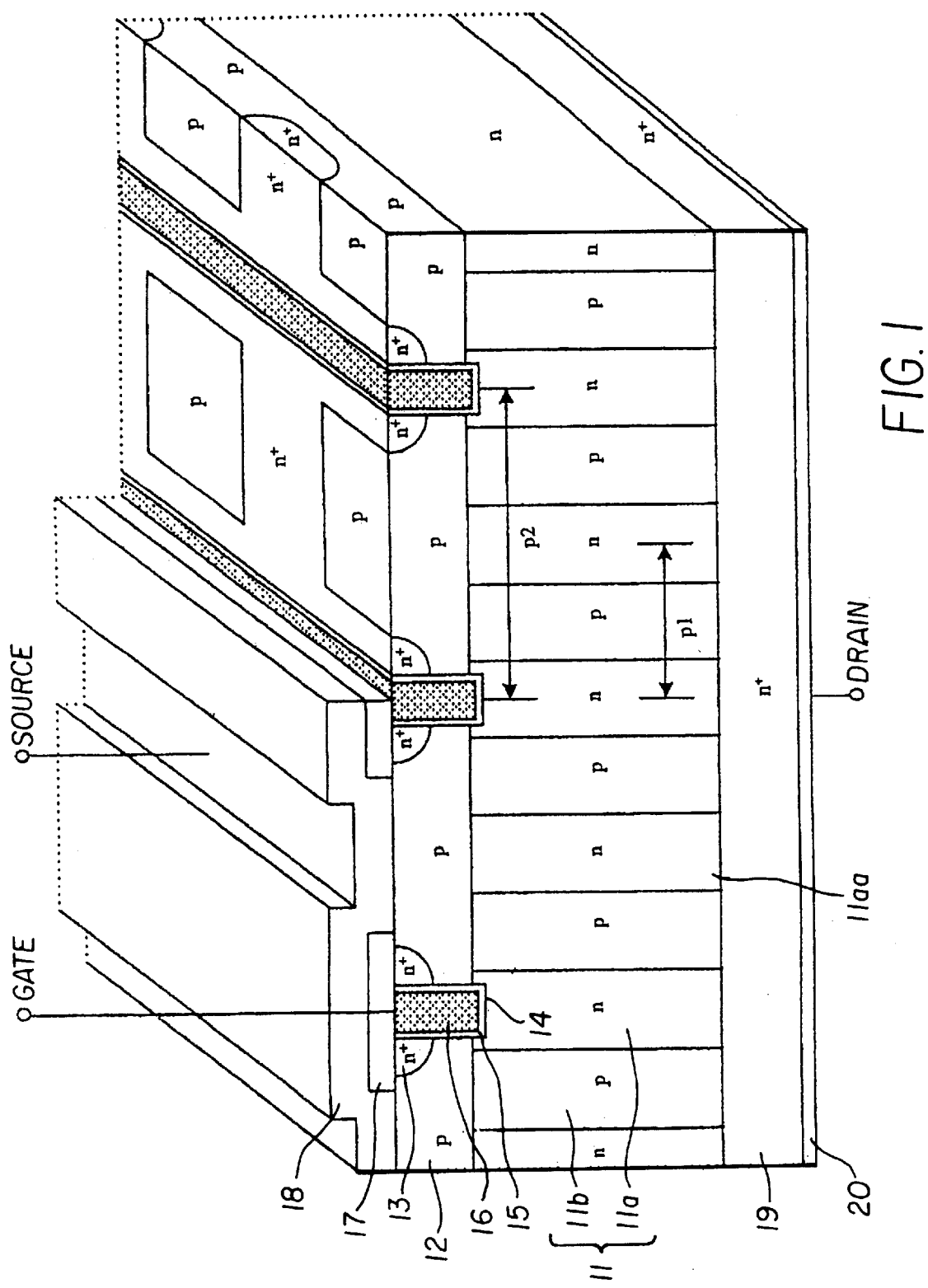
FIG. 1 is a perspective cross sectional view of an n-channel super-junction MOSFET according to the first embodiment of the invention.

FIG. 1 is a perspective cross sectional view of an n-channel super-junction MOSFET according to a first embodiment of the invention.

In the following descriptions, the n-type layer or the n-type region is a layer or a region, therein electrons are majority carriers. The p-type layer or the p-type region is a layer or a region, therein holes are majority carriers. The suffix "+" on the right shoulder of the letter "n" or "p", indicating the conductivity type of the layer or the region, indicates that the relevant region or the layer is doped relatively heavily. The suffix "−" on the right shoulder of the letter "n" or "p", indicating the conductivity type of the layer or the region, indicates that the region or the layer is doped relatively lightly.

Referring now to FIG. 1, the super-junction MOSFET according to the first embodiment includes an n+-type drain layer 19 and an alternating conductivity type layer 11 formed of n-type drift regions 11a and p-type partition regions 11b arranged alternately and parallel to each other. The super-junction MOSFET further includes p-type well regions 12 and an n+-type source region 13 in the surface portion of each p-type well region 12. In a horizontal cross section, n-type drift regions 11a and p-type partition regions 11b are arranged in a stripe pattern.

Trenches 14 extend vertically from the surfaces of n+-type source regions 13 to every other n-type drift region 11a. A polycrystalline silicon gate electrode 16 is in every trench 14 with a gate oxide film 15 interposed therebetween. Stripes of trenches 14 extend horizontally and parallel to each other. The repeating pitch (P2), where the trenches are aligned repeatedly, is wider than the repeating pitch (P1), where a pair of drift region 11a and partition region 11b is repeated.

The n+-type source region 13 is shaped with a ladder. A source electrode 18 is in contact with n+-type source regions 13. Source electrode 18 is in contact also with p-type well regions 12. An interlayer insulation film 17 isolates gate electrode 16 and source electrode 18 from each other. Interlayer insulation film 17 is a thermally oxidized film or a film of phosphate silicate glass (PSG). A drain electrode 20 is on the back surface of n+-type drain layer 19. As shown in FIG. 1, source electrode 18 is very often extended above gate electrodes 16 with interlayer insulation films 17 interposed therebetween.

The typical dimensions and impurity concentrations of the constituent layers and regions for the MOSFET of the 600 V class are as follows.

The alternating conductivity type layer 11 is 40 $\mu$m in thickness. The widths of n-type drift region 11a and p-type partition region 11b are the same 5.0 $\mu$m. The impurity concentrations in n-type drift region 11a and p-type partition region 11b are the same $3.0 \times 10^{15} \text{cm}^{-3}$. Trenches 14 are 4.0 $\mu$m in depth and 2.0 $\mu$m in width. The diffusion depth of p-type well regions 12 is 3.0 $\mu$m. The surface impurity concentration of p-type well regions 12 is $3.0 \times 10^{17} \text{cm}^{-3}$. The diffusion depth of n+-type source regions 13 is 1.0 $\mu$m. The surface impurity concentration of n+-type source regions 13 is $3.0 \times 10^{20} \text{cm}^{-3}$. The impurity concentration in n+-type drain layer 19 is $2.0 \times 10^{18} \text{cm}^{-3}$. The thickness of n+-type drain layer 19 is 300 $\mu$m. The repeating pitch P1 in the alternating conductivity type layer 11 is 10 $\mu$m, and the repeating pitch P2 of trenches 14 is 20 $\mu$m.

The MOSFET of FIG. 1 operates in the following manner.

First, gate electrodes 16 and source electrode 18 are connected electrically and a voltage which is positive with respect to the potential of source electrode 18 is applied to drain electrode 20. Since p-type partition regions 11b are connected to source electrode 18 via p-type well regions 12 and gate electrodes 16 are fixed at a potential same with the potential of source electrode 18. Depletion layers expand laterally from the pn-junctions between p-type partition regions 11b and n-type drift regions 11a.

Since the alternating conductivity type layer 11 is depleted completely as the positive voltage applied to drain electrode 20 is further boosted, the depletion layers expand throughout n+-type drain layer 19, and a high breakdown voltage is maintained until the electric field strength across the MIS junctions between the bottoms of trenches 14 and n-type drift regions 11a, the electric field strength across the pn-junctions between p-type well regions 12 and n-type drift regions 11a or the electric field strength across the pn-junctions between p-type partition regions 11b and n+-type drain layer 19 reaches the critical value.

The MOSFET is switched from the OFF state to the ON state by applying a voltage which is positive with respect to the potential of source electrode 18 to gate electrodes 16. When the applied positive voltage is high enough to create channels, n-type channels are created in the surface portions of the side walls of trenches 14. Electrons flow from n⁺-type source regions 13 to drain electrode 20 via the created n-type channels, the n-type drift regions 11*a* in direct contact with trenches 14, and n⁺-type drain layer 19.

Since the repeating pitch P1 in the alternating conductivity type layer 11 is half the repeating pitch P2 of trenches 14, the n-type drift regions 11*aa* are not in direct contact with trenches 14 are not effective to make the drift current flow.

Due to the mechanism described above, the on-resistance component Rdrift attributed to the drift regions is a little bit higher than that for the structure, in that the repeating pitch P2 of trenches 14 is the same with the repeating pitch P1, where the n-type drift regions are arranged repeatedly. However, since the gate area per unit area is narrower, the input capacitance and the feedback capacitance are reduced and high-speed switching is facilitated.

Second Embodiment

Figure 2:
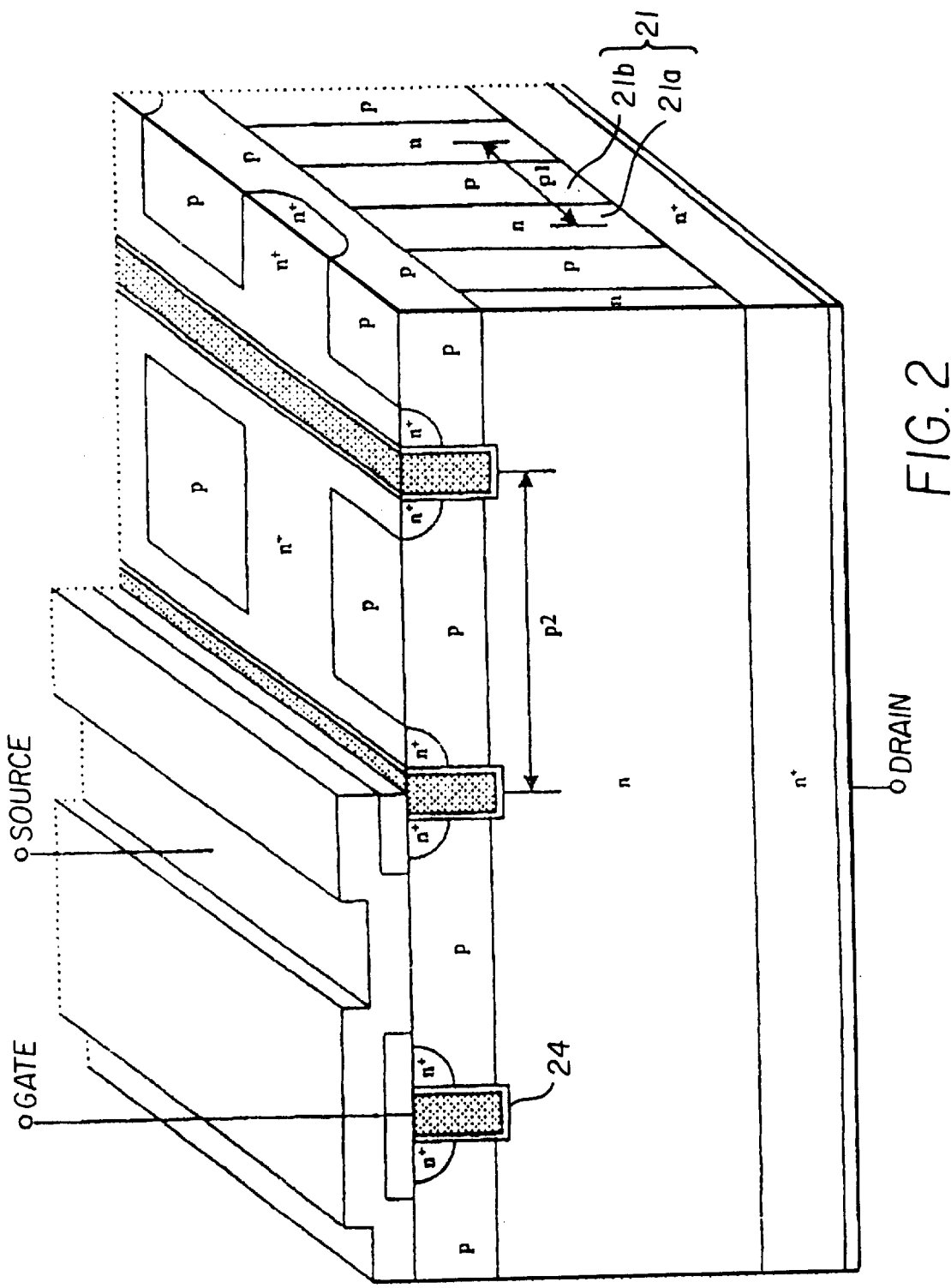
FIG. 2 is a perspective cross sectional view of an n-channel super-junction MOSFET according to the second embodiment of the invention.

FIG. 2 is a perspective cross sectional view of an n-channel super-junction MOSFET according to a second embodiment of the invention.

The super-junction MOSFET according to the second embodiment is a modification of the super-junction MOSFET according to the first embodiment. In the MOSFET according to the second embodiment, the stripes of trenches 24 extend perpendicular to the stripes of n-type drift regions 21*a* and p-type partition regions 21*b* in an alternating conductivity type layer 21. The other configurations are the same with those in the MOSFET according to the first embodiment. The typical dimensions are as follows. The repeating pitch P2 for trenches 24 is 20 μm. The repeating pitch P1 in the alternating conductivity type layer 21 is 10 μm.

Since the gate area per unit area is narrowed by arranging trenches 24 at the repeating pitch P2 wider than the repeating pitch P1 in the alternating conductivity type layer 21, the input capacitance and the feedback capacitance are reduced and high-speed switching is facilitated in the same way as according to the first embodiment.

According to the first embodiment, the ratio of the repeating pitch P2 and the repeating pitch P1 is an integer number. According to the second embodiment that extends the stripes of trenches 24 perpendicular to the stripes of n-type drift regions 21*a* and p-type partition regions 21*b* in an alternating conductivity type layer 21, the ratio of the repeating pitch P2 and the repeating pitch P1 is set at any arbitrary value.

Since it is not necessary for the MOSFET according to the second embodiment to precisely adjust the locations of the n-type drift regions 21*a* and the locations of the trenches, the MOSFET according to the second embodiment is manufactured easily. The repeating pitch P2 and the repeating pitch P1 may be preferably set at respective appropriate values according to the second embodiment. Since the stripes of trenches 24 are extended perpendicular to the stripes of n-type drift regions 21*a* and p-type partition regions 21*b* in an alternating conductivity type layer 21, the effective source length according to the second embodiment is about half the effective source length according to the first embodiment. Therefore, the on-resistance increases a little bit according to the second embodiment.

Third Embodiment

Figure 3:
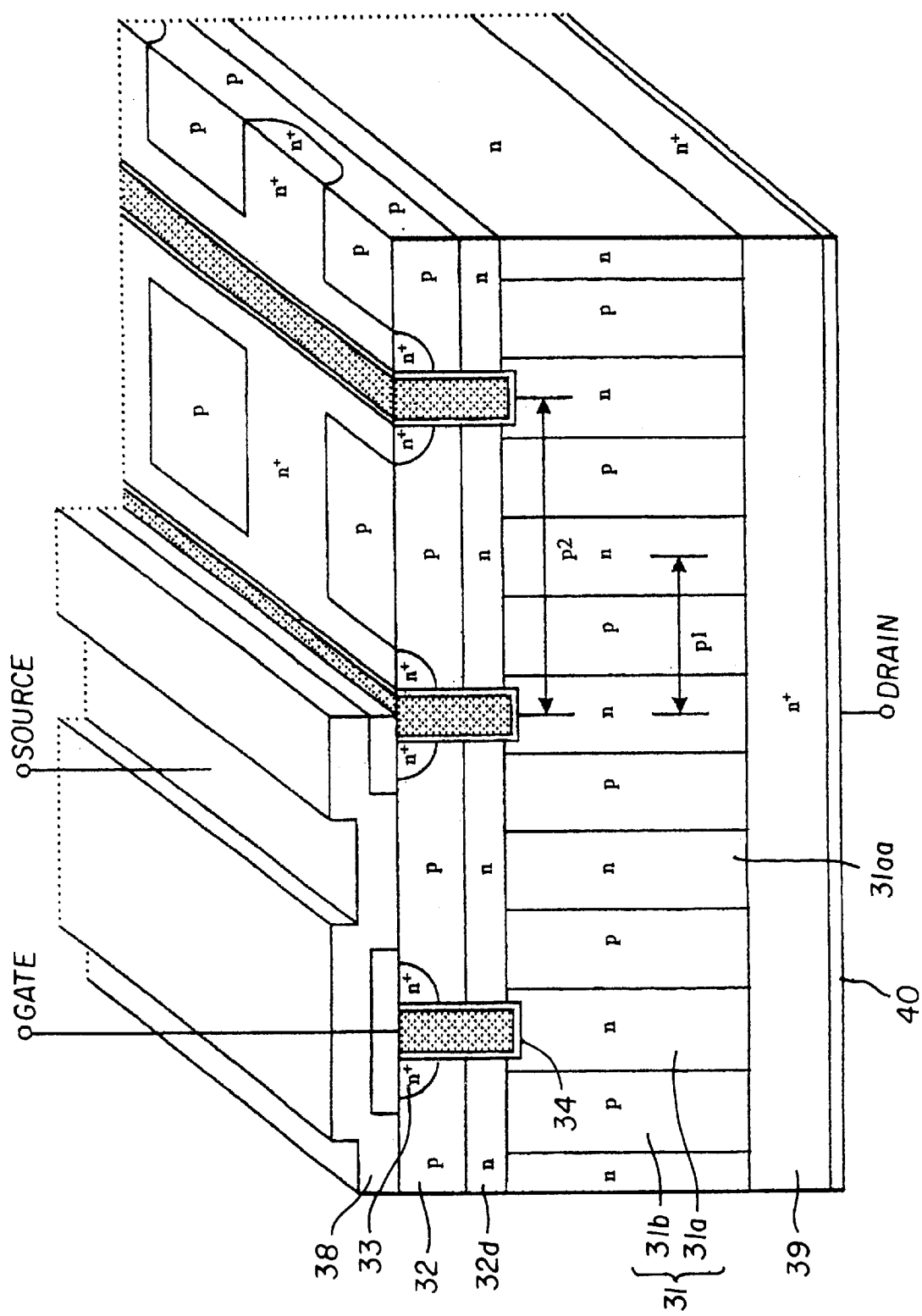
FIG. 3 is a perspective cross sectional view of an n-channel super-junction MOSFET according to the third embodiment of the invention.

FIG. 3 is a perspective cross sectional view of an n-channel super-junction MOSFET according to a third embodiment of the invention.

The super-junction MOSFET according to the third embodiment has a structure almost the same with that of the MOSFET according to the first embodiment except that the MOSFET according to the third embodiment includes n-type channel regions 32*d* between p-type well regions 32 and the alternate arrangement of n-type drift regions 31*a* and p-type partition regions 31*b*. Typical impurity concentrations and dimensions are as follows. The impurity concentration in n-type channel regions 32*d* is $2.0 \times 10^{15}$ cm$^{-3}$. The n-type channel regions 32*d* are 2.0 μm in thickness. Trenches 34 are 6.0 μm in depth and 2.0 μm in width. The repeating pitch P2 of trenches 34 is 20 μm and the repeating pitch P1 in an alternating conductivity type layer 31 is 10 μm.

The MOSFET according to the third embodiment including n-type channel regions 32*d* between p-type well regions 32 and the alternate arrangement of n-type drift regions 31*a* and p-type partition regions 31*b* operates in the following manner.

First, gate electrodes 36 and a source electrode 38 are connected electrically and a voltage which is positive with respect to the potential of source electrode 38 is applied to a drain electrode 40. Since p-type partition regions 31*b* are isolated from p-type well regions 32 by n-type channel regions 32*d*, depletion regions expand from the pn-junctions between p-type well regions 32 and n-type channel regions 32*d* into n-type channel regions 32*d* and from the bottoms of trenches 34 into n-type drift regions 31*a* and n-type channel regions 32*d*.

As the voltage applied to drain electrodes 40 is boosted, the depletion layers in n-type channel regions 32*d* reach the alternating conductivity type layer 31. Since p-type well regions 32 and p-type partition regions 31*b* are connected electrically, the depletion layers expand laterally perpendicular to the pn-junctions between p-type partition regions 31*b* and n-type drift regions 31*a*. As the voltage applied to drain electrodes 40 is further boosted, the alternating conductivity type layer 31 is depleted completely, the depletion layers expand toward n⁺-type drain layer 39. A high breakdown voltage is maintained until the electric field strength across the MIS junctions between the bottoms of trenches 34 and n-type drift regions 31*a* or the electric field strength across the pn-junctions between p-type well regions 32 and n-type drift regions 31*a* reaches the critical value. It is necessary to set the thickness and the impurity concentration of n-type channel regions 32*d* at respective appropriate values, where the electric field strength across the pn-junctions between p-type well regions 32 and n-type drift regions 31*a* never reaches the critical value before the alternating conductivity type layer 31 is depleted.

The MOSFET is switched from the OFF state to the ON state by applying a voltage which is positive with respect to the potential of source electrode 38 to gate electrodes 36. When the applied positive voltage is high enough to create channels, n-type channels are created in the surface portions of the side walls of trenches 34. Electrons flow from n⁺-type source regions 33 to n-type channel regions 32*d* via the created n-type channels. Then, a part of the electrons that have reached n-type channel regions 32*d* flows to n⁺-type drain layer 39 via the n-type drift regions 31*a* in direct contact with trenches 34 and, then, to drain electrode 40. The other part of the electrons that have reached n-type channel regions 32d flows laterally through n-type channel regions 32d to the n-type drift regions 31aa are not in direct contact with trenches 34. The electrons that have reached the n-type drift regions 31aa flow to n+-type drain layer 39 and, finally, to drain electrode 40.

Since the repeating pitch P2 of trenches 34 and the repeating pitch P1 in the alternating conductivity type layer 31 according to the third embodiment are the same with the repeating pitch P2 and the repeating pitch P1 according to the first embodiment, the input capacitance and the feedback capacitance of the MOSFET according to the third embodiment are almost the same with those of the MOSFET according to the first embodiment.

Since electrons flow through the n-type drift regions 31a in contact with trenches 34 and also through the n-type drift regions 31aa not in contact with trenches 34, the on-resistance across the alternating conductivity type layer is reduced as compared with the MOSFET according to the first embodiment. Therefore, the MOSFET according to the third embodiment facilitates high-speed switching at low on-resistance lower than that of the MOSFET according to the first embodiment.

Fourth Embodiment

Figure 4:
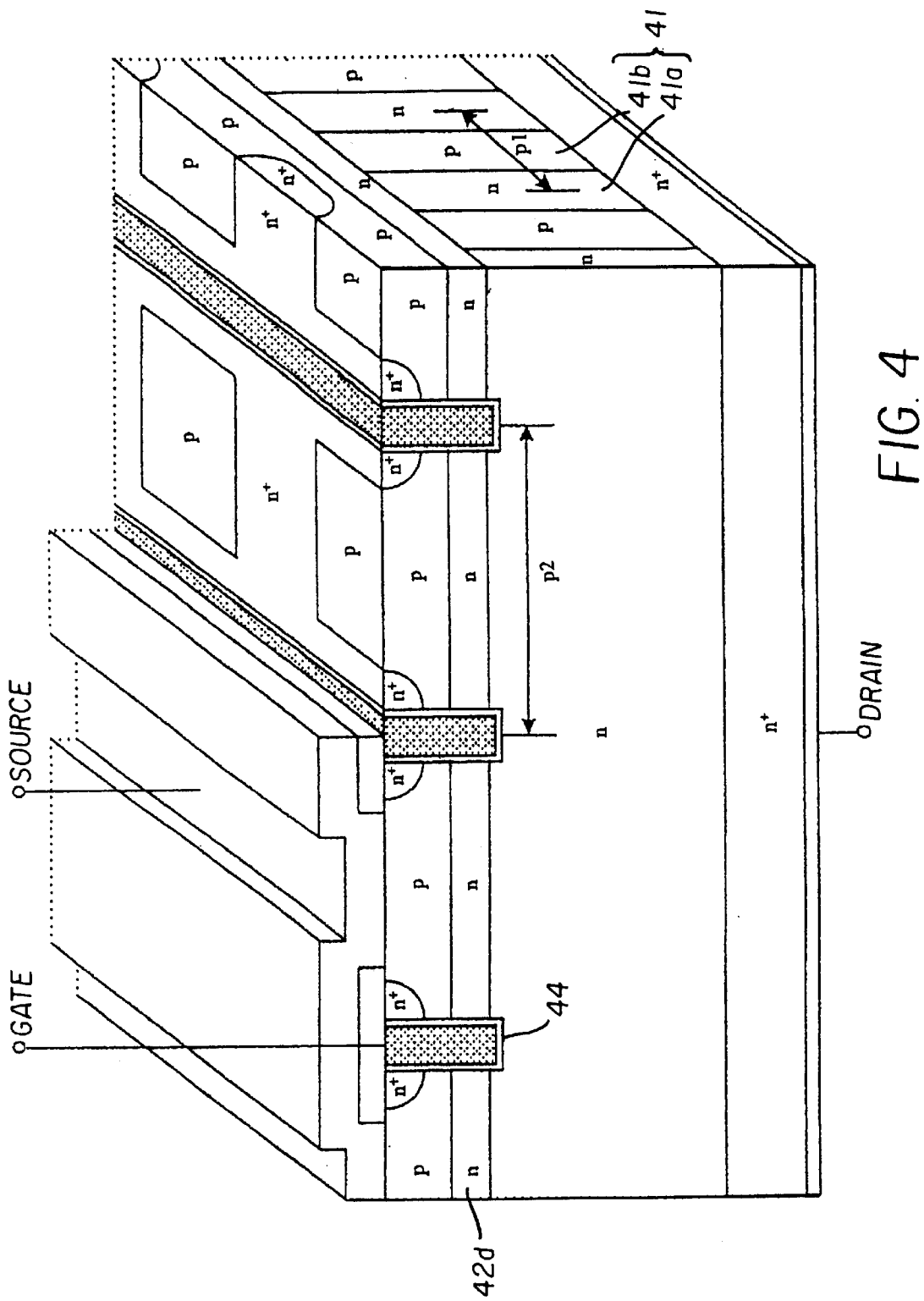
FIG. 4 is a perspective cross sectional view of an n-channel super-junction MOSFET according to the fourth embodiment of the invention.

FIG. 4 is a perspective cross sectional view of an n-channel super-junction MOSFET according to a fourth embodiment of the invention.

The MOSFET according to the fourth embodiment is a modification of the MOSFET according to the third embodiment. In the MOSFET according to the fourth embodiment, the stripes of trenches 44 extend perpendicular to the stripes of n-type drift regions 41a and p-type partition regions 41b in an alternating conductivity type layer 41. The other configurations are the same with those in the MOSFET according to the third embodiment.

Although the stripes of trenches 44 extend perpendicular to the stripes of n-type drift regions 41a and p-type partition regions 41b in an alternating conductivity type layer 41, the on-resistance of the MOSFET according to the fourth embodiment is almost the same with the on-resistance of the MOSFET according to the third embodiment.

Since it is not necessary for the MOSFET according to the fourth embodiment to precisely adjust the locations of trenches 44 and the locations of n-type drift regions 41a and since it is possible to adjust the repeating pitch P2 of trenches 44 independently of the repeating pitch P1 in the alternating conductivity type layer 41, the input capacitance and the feedback capacitance are set easily at respective arbitrary values.

Fifth Embodiment

Figure 5:
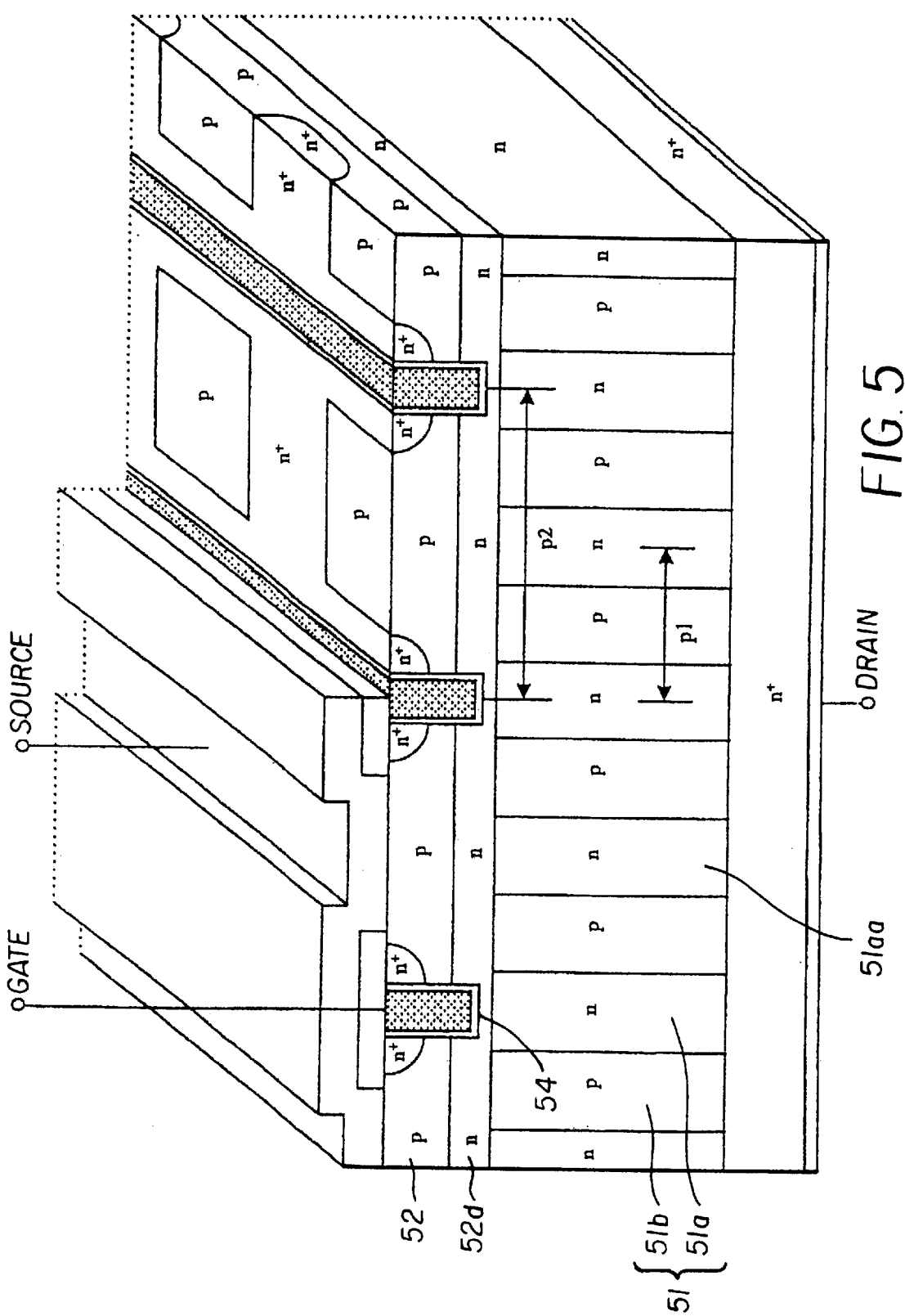
FIG. 5 is a perspective cross sectional view of an n-channel super-junction MOSFET according to the fifth embodiment of the invention.

FIG. 5 is a perspective cross sectional view of an n-channel super-junction MOSFET according to a fifth embodiment of the invention. Referring now to FIG. 5, the MOSFET according to the fifth embodiment has a structure almost the same with that of the MOSFET according to the third embodiment. The MOSFET according to the fifth embodiment includes an n-type channel region 52d between p-type well regions 52 and the alternate arrangement of n-type drift regions 51a and p-type partition regions 51b. Trenches 54 in the MOSFET according to the fifth embodiment are deep enough to reach the inside of n-type channel region 52d but not so deep enough as to reach any n-type drift region 51a. Typically, trenches 54 are 5.0 □m in depth. The MOSFET according to the fifth embodiment operates in the same manner as the MOSFET according to the third embodiment.

Since trenches 54 are dug not so deeply as to reach n-type drift regions 51a, electrons flow into n-type channel region 52d via n-channels created in the ON-state of the MOSFET. The electrons that have reached n-type channel region 52d flow evenly into the n-type drift regions 51a below trenches 54 and the n-type drift regions 51aa, above that any trench is not formed.

The on-resistance of the MOSFET according to the fifth embodiment is almost the same with that of the MOSFET according to the third embodiment. Since it is not necessary to adjust the locations of trenches 54 and the locations of the n-type drift regions 51a, the MOSFET according to the fifth embodiment is manufactured more easily than the MOSFET according to the third embodiment.

Sixth Embodiment

Figure 6:
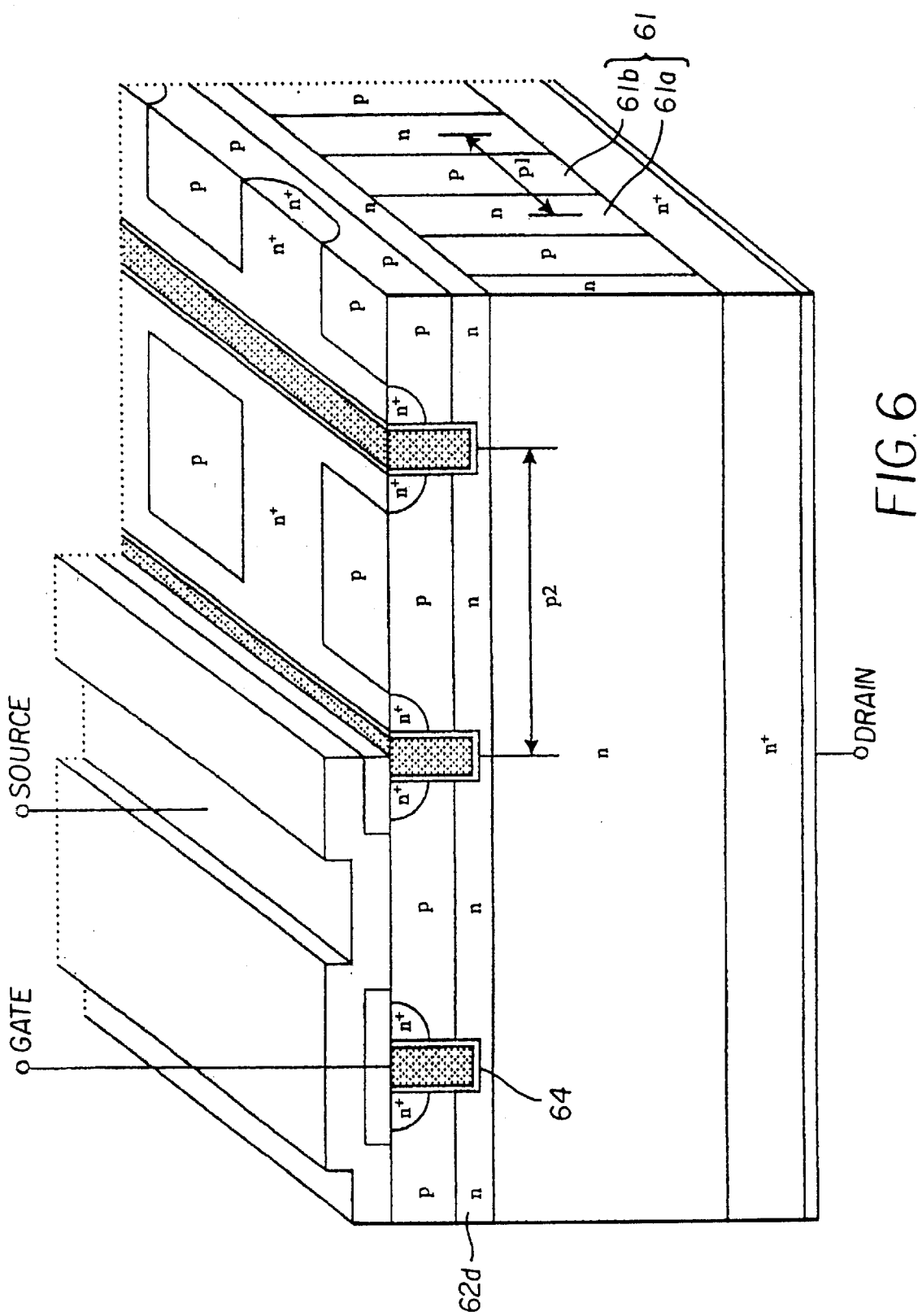
FIG. 6 is a perspective cross sectional view of an n-channel super-junction MOSFET according to the sixth embodiment of the invention.

FIG. 6 is a perspective cross sectional view of an n-channel super-junction MOSFET according to a sixth embodiment of the invention.

The MOSFET according to the sixth embodiment is a modification of the MOSFET according to the fifth embodiment. In the MOSFET according to the sixth embodiment, the stripes of trenches 64 extend perpendicular to the stripes of n-type drift regions 61a and p-type partition regions 61b in an alternating conductivity type layer 61. The other configurations are the same with those in the MOSFET according to the fifth embodiment.

Since trenches 64 are not so deep as to reach n-type drift regions 61a and since it is not necessary for the MOSFET according to the sixth embodiment to precisely adjust the locations of trenches 64 and the locations of n-type drift regions 61a, the MOSFET according to the sixth embodiment is manufactured easily. Moreover, since it is possible to adjust the repeating pitch P2 of trenches 64 independently of the repeating pitch P1 in the alternating conductivity type layer 61, the input capacitance and the feedback capacitance are set easily at respective arbitrary values.

Even when the stripes of trenches 64 extend perpendicular to the stripes of n-type drift regions 61a and p-type partition regions 61b in the alternating conductivity type layer 61, the on-resistance of the MOSFET according to the sixth embodiment is almost the same with the on-resistance of the MOSFET according to the fifth embodiment.

Thus, the MOSFET according to the sixth embodiment facilitates reducing the input capacitance, the feedback capacitance and the on-resistance.

Seventh Embodiment

Figure 7:
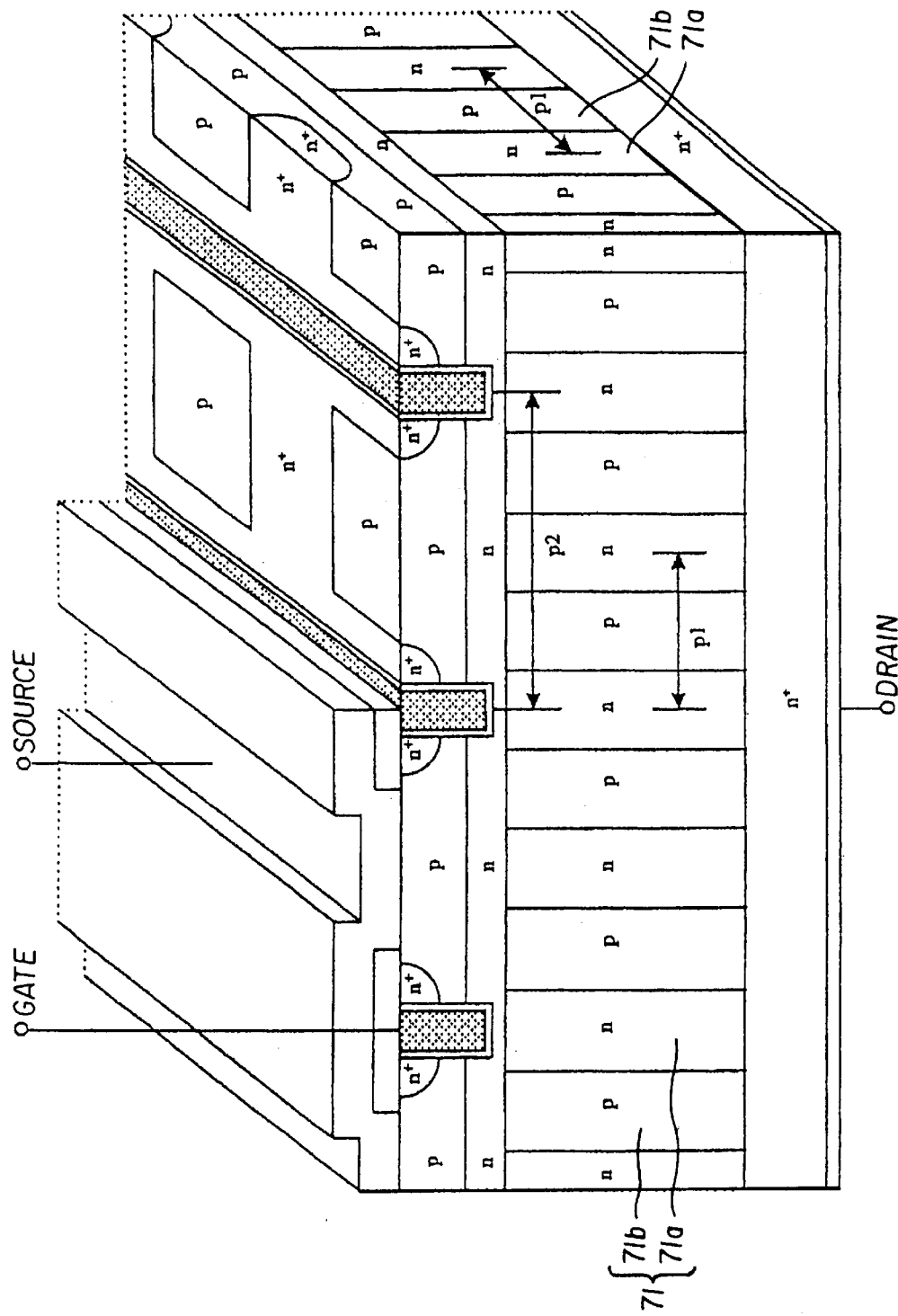
FIG. 7 is a perspective cross sectional view of an n-channel super-junction MOSFET according to the seventh embodiment of the invention.

FIG. 7 is a perspective cross sectional view of an n-channel super-junction MOSFET according to a seventh embodiment of the invention.

The MOSFET according to the seventh embodiment is another modification of the MOSFET according to the fifth embodiment. In the MOSFET according to the seventh embodiment, n-type drift regions 71a and p-type partition regions 71b are not shaped with stripes. The n-type drift regions 71a are located at the lattice points of a planar orthogonal lattice and p-type partition regions 71b are in the spaces between n-type drift regions 71a, forming a checkered pattern.

As far as the impurity concentrations in n-type drift regions 71a and p-type partition regions 71b are the same, n-type drift regions 71a and p-type partition regions 71b may be arranged in a stripe pattern or in a checkered pattern. In any arrangement, the MOSFET according to the seventh embodiment facilitates reducing the input capacitance, the feedback capacitance and the on-resistance as the MOSFET according to the sixth embodiment does.

Still alternatively, n-type drift regions 71a may be located at the lattice points of a trigonal lattice or a hexagonal lattice with p-type partition regions 71b located at the other lattice points thereof or with p-type partition regions 71b located between n-type drift regions 71a.

Vice versa, p-type partition regions 71b may be located at the lattice points of an orthogonal lattice, a trigonal lattice or a hexagonal lattice and n-type drift regions 71a may be located between p-type partition regions 71b.

Eighth Embodiment

Figure 8:
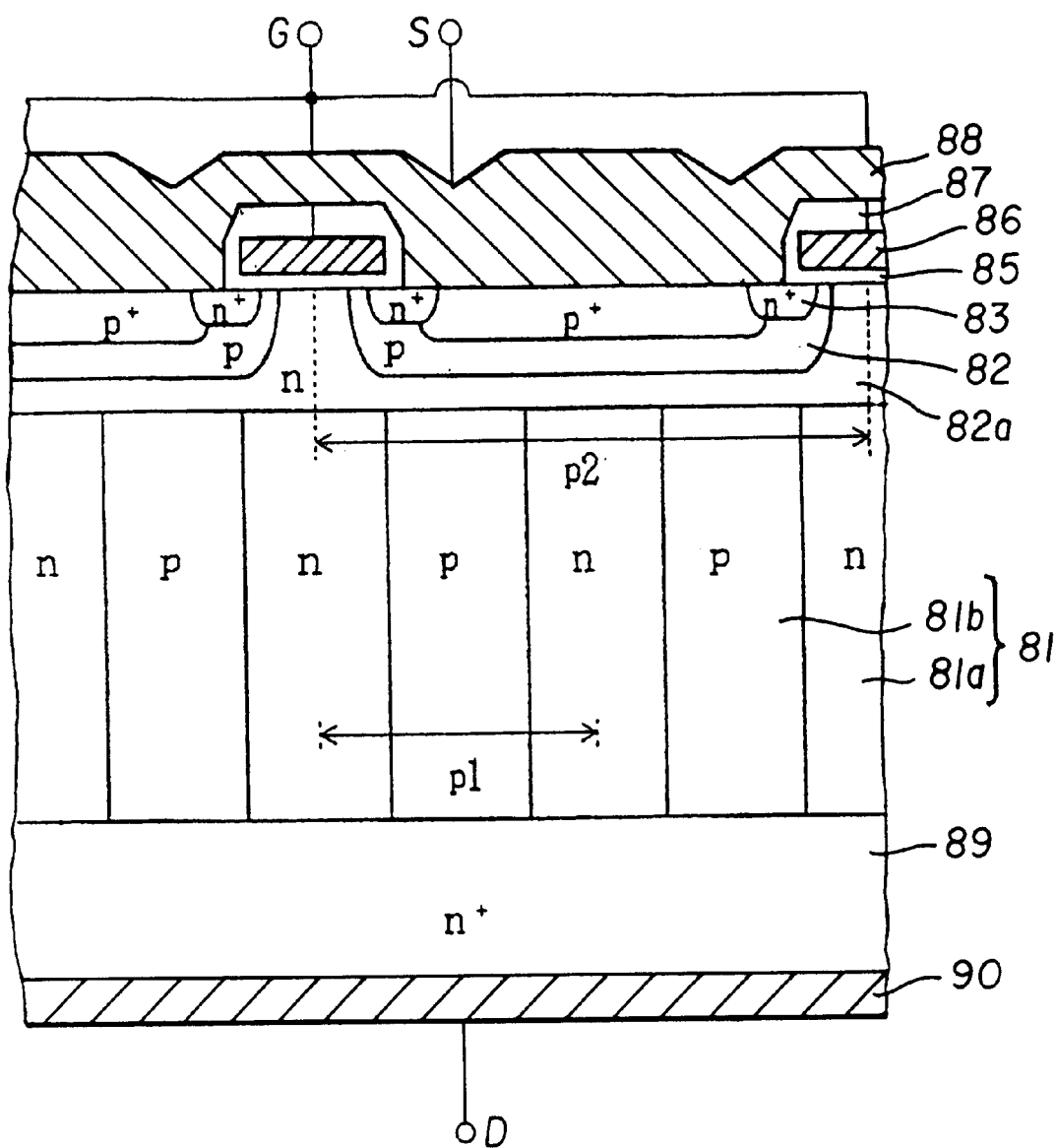
FIG. 8 is a cross sectional view of an n-channel super-junction MOSFET according to the eighth embodiment of the invention.

FIG. 8 is a cross sectional view of an n-channel super-junction MOSFET according to an eighth embodiment of the invention.

The MOSFET according to the eighth embodiment is not a trench-gate MOSFET but a planar MOSFET. Referring now to FIG. 8, the MOSFET according to the eighth embodiment includes an n$^+$-type drain layer 89 and an alternating conductivity type layer 81 on n$^+$-type drain layer 89. The alternating conductivity type layer 81 is formed of n-type drift regions 81a and p-type partition regions 81b alternately arranged laterally. The MOSFET according to the eighth embodiment further includes an n-type channel region 82d on the alternating conductivity type layer 81, p-type well regions 82 in n-type channel region 82d, and n$^+$-type source regions 83 in the surface portions of p-type well regions 82. Horizontally, n-type drift regions 81a and p-type partition regions 81b are arranged in a stripe pattern. The thickness and the impurity concentration of n-type channel region 82d are adjusted at respective appropriate values, where the electric field strength across the pn-junctions between p-type well regions 82 and n-type drift regions 81a never reaches the critical value before the alternating conductivity type layer 81 is depleted. In detail, the thickness of n-type channel region 82d under p-type well regions 82 is set at half the width of n-type drift regions 81a, and the impurity concentration in n-type channel region 82d is set at a value which is greater than or equal to the impurity concentration in n-type drift regions 81a.

A polycrystalline silicon gate electrode 86 is above every other n-type drift region 81a with a gate oxide film 85 interposed therebetween. Gate electrode 86 is shaped with a stripe. The repeating pitch P2, where gate electrodes 86 are located repeatedly, is wider than the repeating pitch P1 in the alternating conductivity type layer 81, where a pair of n-type drift region 81a and p-type partition region 81b are arranged repeatedly.

A source electrode 88 in contact with n$^+$-type source regions 83 is also in contact with p-type well regions 82. An interlayer insulation film 87 isolates gate electrode 86 and source electrode 88 from each other. Interlayer insulation film 87 is a thermally oxidized film or a film of phosphate silicate glass (PSG). A drain electrode 90 is on the back surface of n$^+$-type drain layer 89. In many cases, source electrode 88 is extended above gate electrodes 86 with interlayer insulation films 87 interposed therebetween.

The planar-type MOSFET according to the eighth embodiment, therein the gate area per unit area is narrow, facilitates reducing the input capacitance and the feedback capacitance and realizing high-speed switching.

Alternatively, stripe-shaped gate electrodes 86 may be extended perpendicular to the stripes of n-type drift regions 81a and p-type partition regions 81b. This perpendicular arrangement facilitates setting the repeating pitch P2 of gate electrodes 86 at an arbitrary value.

Since it is not necessary to precisely adjust the locations of gate electrodes 86 and the locations of n-type drift regions 81a, the planar-type MOSFET according to the eighth embodiment is manufactured easily. As described earlier, n-type drift regions 81a, p-type partition regions 81b and gate electrodes 86 are not always shaped with respective stripes. Thus, the invention is effectively applicable not only to the trench-type MOSFET's but also to the planar-type MOSFET's.

Although the invention has been described in connection with the embodiments of the MOSFET's, the invention is applicable also to IGBT's, bipolar transistors, thyristors and IC's of these semiconductor devices.

Although the embodiments of the invention include a drain electrode on the back surface of an n$^+$-type drain layer, the n$^+$-type drain layer may be extended onto the surface of the semiconductor chip, thereon the source electrode is formed, and the drain electrode may be formed on the extended portion of the n$^+$-type drain layer, that is on the side of the semiconductor chip, thereon the source electrode is formed.

As described above, the semiconductor device according to the invention includes an alternating conductivity type layer formed of drift regions of a first conductivity type and partition regions of a second conductivity type; the drift regions and the partition regions being arranged alternately at a first repeating pitch; gate electrodes above the first major surface of the semiconductor chip with respective gate oxide films interposed therebetween or in the trenches dug from the first major surface of the semiconductor chip with respective gate oxide films interposed therebetween, the gate electrodes being arranged at a second repeating pitch; well regions of the second conductivity type; source regions of the first conductivity type isolated by the respective well regions from the drift regions; and the second repeating pitch being wider than the first repeating pitch. The semiconductor device according to the invention facilitates reducing the on-resistance and realizing high-speed switching.

The one or more channel regions of the first conductivity type between the partition regions of the second conductivity type and the well regions of the second conductivity type facilitate further reducing the on-resistance and manufacturing the super-junction semiconductor device.

The semiconductor structure according to the invention facilitates further improving the characteristics of the super-junction semiconductor device, that has reduced the tradeoff relation between the onk-resistance and the breakdown voltage.

What is claimed is:

1. A semiconductor device comprising:
   a semiconductor chip having a first major surface and a second major surface facing opposite to the first major surface;
   a first main electrode on the first major surface;
   a second main electrode on the second major surface;
   a layer with low electrical resistance on the side of the second major surface;
   an alternating conductivity type layer between the first major surface and the layer with low electrical resistance, the alternating conductivity type layer including a plurality of first semiconductor regions of a first conductivity type and a plurality of second semiconductor regions of a second conductivity type arranged alternately;

a pair of the first semiconductor region and the second semiconductor region being repeated at a first repeating pitch;

a plurality of trenches dug from the first major surface;

a plurality of gate electrodes buried in each of the trenches with a gate oxide film interposed therebetween, the gate electrodes being arranged repeatedly at a second repeating pitch different from the first repeating pitch;

a plurality of well regions of the second conductivity type in contact with the gate oxide films in the side walls of the trenches; and a plurality of source regions of the first conductivity type isolated by the well regions from the first semiconductor regions, the source regions contacting with the gate oxide films in the side walls of the trenches, wherein the second repeating pitch is wider than the first repeating pitch.

2. The semiconductor device according to claim 1, further comprising:

one or more third semiconductor regions of the first conductivity type between the well regions and the alternate arrangement of the first semiconductor regions and the second semiconductor regions, the one or more third semiconductor regions being connected to the first semiconductor regions.

3. The semiconductor device according to claim 2, wherein the trenches are dug deeply enough to reach the one or more third semiconductor regions.

4. The semiconductor device according to claim 2, wherein the trenches are dug deeply enough to reach the inside portions of the first semiconductor regions.

5. A semiconductor device comprising:

a semiconductor chip having a first major surface and a second major surface facing opposite to the first major surface;

a first main electrode on the first major surface;

a second main electrode on the second major surface;

a layer with low electrical resistance on the side of the second major surface;

an alternating conductivity type layer between the first major surface and the layer with low electrical resistance, the alternating conductivity type layer including a plurality of first semiconductor regions of a first conductivity type and a plurality of second semiconductor regions of a second conductivity type arranged alternately;

a pair of the first semiconductor region and the second semiconductor region being repeated at a first repeating pitch;

a plurality of gate electrodes above the first major surface of the semiconductor chip with gate oxide films interposed therebetween, the gate electrodes being arranged repeatedly at a second repeating pitch different from the first repeating pitch;

a plurality of well regions of the second conductivity type in contact with the gate oxide films;

a plurality of source regions of the first conductivity type isolated by the well regions from the first semiconductor regions, the source regions contacting with the gate oxide films; and one or more third semiconductor regions of the first conductivity type between the well regions and the alternate arrangement of the first semiconductor regions and the second semiconductor regions, the one or more third semiconductor regions being connected to the first semiconductor regions, wherein the second repeating pitch is wider than the first repeating pitch.

6. The semiconductor device according to claim 1, wherein the horizontal arrangement of the gate electrodes is shaped with a stripe pattern.

7. The semiconductor device according to claim 5, wherein the horizontal arrangement of the gate electrodes is shaped with a stripe pattern.

8. The semiconductor device according to claim 1, wherein the net impurity concentrations in the first semiconductor regions and the second semiconductor regions are almost the same.

9. The semiconductor device according to claim 5, wherein the net impurity concentrations in the first semiconductor regions and the second semiconductor regions are almost the same.

10. The semiconductor device according to claim 1, wherein the boundaries between the first semiconductor regions and the second semiconductor regions extend almost perpendicular to the first major surface or the second major surface of the semiconductor chip.

11. The semiconductor device according to claim 5, wherein the boundaries between the first semiconductor regions and the second semiconductor regions extend almost perpendicular to the first major surface or the second major surface of the semiconductor chip.

12. The semiconductor device according to claim 1, wherein the horizontal arrangement of the first semiconductor regions and the second semiconductor regions are shaped with respective stripes.

13. The semiconductor device according to claim 5, wherein the horizontal arrangement of the first semiconductor regions and the second semiconductor regions are shaped with respective stripes.

14. The semiconductor device according to claim 12, wherein the stripes of the first semiconductor regions and the second semiconductor regions extend almost perpendicular to the stripes of the gate electrodes.

15. The semiconductor device according to claim 13, wherein the stripes of the first semiconductor regions and the second semiconductor regions extend almost perpendicular to the stripes of the gate electrodes.

16. The semiconductor device according to claim 1, wherein the horizontal arrangement of the first semiconductor regions or the second semiconductor regions are located at the lattice points of a two-dimensional trigonal lattice, a two-dimensional orthogonal lattice or a two-dimensional hexagonal lattice.

17. The semiconductor device according to claim 5, wherein the horizontal arrangement of the first semiconductor regions or the second semiconductor regions are located at the lattice points of a two-dimensional trigonal lattice, a two-dimensional orthogonal lattice or a two-dimensional hexagonal lattice.

18. The semiconductor device according to claim 1, wherein the horizontal arrangement of the gate electrodes are arranged in a two-dimensional trigonal lattice, a two-dimensional orthogonal lattice or a two-dimensional hexagonal lattice.

19. The semiconductor device according to claim 5, wherein the horizontal arrangement of the gate electrodes are arranged in a two-dimensional trigonal lattice, a two-dimensional orthogonal lattice or a two-dimensional hexagonal lattice.

* * * * *